(12) United States Patent
Bauer et al.

(10) Patent No.: US 6,963,437 B2
(45) Date of Patent: Nov. 8, 2005

(54) DEVICES INCORPORATING ELECTROCHROMIC ELEMENTS AND OPTICAL SENSORS

(75) Inventors: Frederick T. Bauer, Holland, MI (US); Joseph S. Stam, Holland, MI (US)

(73) Assignee: GENTEX Corporation, Zeeland, MI (US)

( * ) Notice: Subject to any disclaimer, the term of this patent is extended or adjusted under 35 U.S.C. 154(b) by 0 days.

(21) Appl. No.: 10/659,808

(22) Filed: Sep. 11, 2003

(65) Prior Publication Data

US 2004/0047050 A1 Mar. 11, 2004

Related U.S. Application Data

(63) Continuation of application No. 09/678,586, filed on Oct. 3, 2000, now Pat. No. 6,621,616.

(51) Int. Cl.[7] .............................. G02F 1/03; G02F 1/15; G02F 1/153; G02F 1/1335; H01L 27/00
(52) U.S. Cl. ................. 359/245; 359/265; 359/273; 359/565; 359/654; 359/888; 359/275; 250/208.1; 250/208.2; 349/65; 252/583; 348/342; 348/363; 362/284; 396/96
(58) Field of Search ................. 359/245, 265, 359/266, 273, 275, 279, 234, 565, 601, 604, 654, 885, 887, 888; 250/208.1, 208.2, 394; 349/65, 88; 252/583; 348/342, 363, 364; 396/96, 106; 362/284

(56) References Cited

U.S. PATENT DOCUMENTS

| | | | | |
|---|---|---|---|---|
| 3,084,253 A | * | 4/1963 | McHenry et al. | 250/394 |
| 5,173,900 A | * | 12/1992 | Miller et al. | 370/349 |
| 5,471,339 A | * | 11/1995 | Ise et al. | 359/275 |
| 5,550,677 A | * | 8/1996 | Schofield et al. | 359/604 |
| 5,585,968 A | * | 12/1996 | Guhman et al. | 359/654 |
| 5,796,094 A | * | 8/1998 | Schofield et al. | 250/208.1 |
| 5,808,806 A | * | 9/1998 | Guhman et al. | 359/654 |
| 5,880,872 A | * | 3/1999 | Udaka | 359/273 |
| 5,888,431 A | * | 3/1999 | Tonar et al. | 252/583 |
| 6,008,941 A | * | 12/1999 | Feldman et al. | 359/565 |
| 6,011,640 A | * | 1/2000 | Hutton | 359/234 |
| 6,021,009 A | * | 2/2000 | Borodovsky et al. | 359/888 |
| 6,091,451 A | * | 7/2000 | Farr et al. | 348/342 |
| 6,248,263 B1 | * | 6/2001 | Tonar et al. | 252/583 |
| 6,426,492 B1 | * | 7/2002 | Bos et al. | 250/208.1 |
| 6,445,884 B1 | * | 9/2002 | Yahav | 396/106 |
| 6,654,556 B2 | * | 11/2003 | Braun et al. | 396/96 |
| 6,667,471 B2 | * | 12/2003 | Bos et al. | 250/208.1 |

* cited by examiner

Primary Examiner—Loha Ben
(74) Attorney, Agent, or Firm—James E. Shultz, Jr.

(57) ABSTRACT

The device of the present invention includes an electrochromic element having a transmittance that varies in response to an electrical signal, a base substrate disposed in spaced relation to the electrochromic element, a seal disposed between the base substrate and the electrochromic element, and an optical sensor. The seal, base substrate, and electrochromic element form a sealed cavity therebetween, in which the optical sensor is disposed. According to another embodiment, an electrochromic device is provided that includes a first substrate, an electrochromic medium disposed on the first substrate, a pair of electrodes in contact with the electrochromic medium, a pair of conductive clips, each in electrical contact with a respective one of the electrodes, and two pairs of electrical lead posts for mounting the first substrate to the circuit board. Each pair of lead posts is attached to, and extends from, a respective one of the conductive clips. According to another embodiment, an imaging device is disclosed having an image recorder for recording a scene or object, and an electrochromic element positioned between the image recorder and the object or scene to be imaged. The electrochromic element is configured to exhibit a non-uniform transmittance in response to an applied electrical signal.

39 Claims, 9 Drawing Sheets

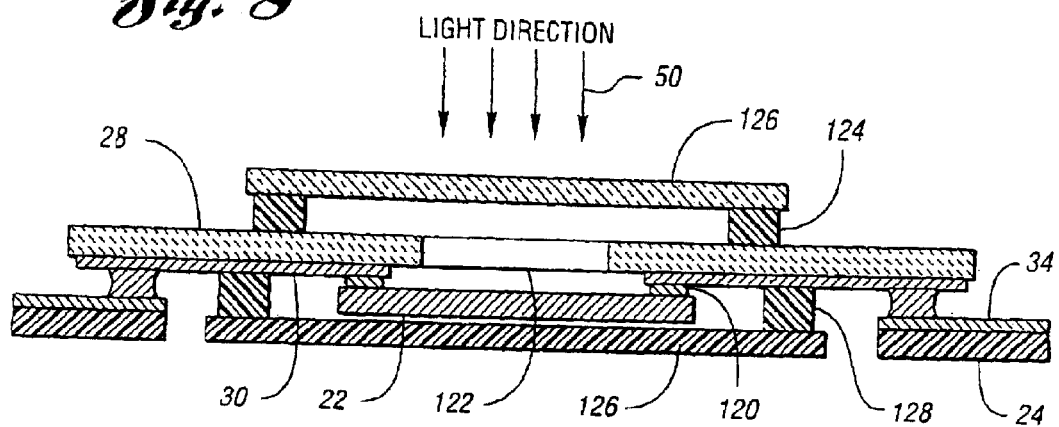
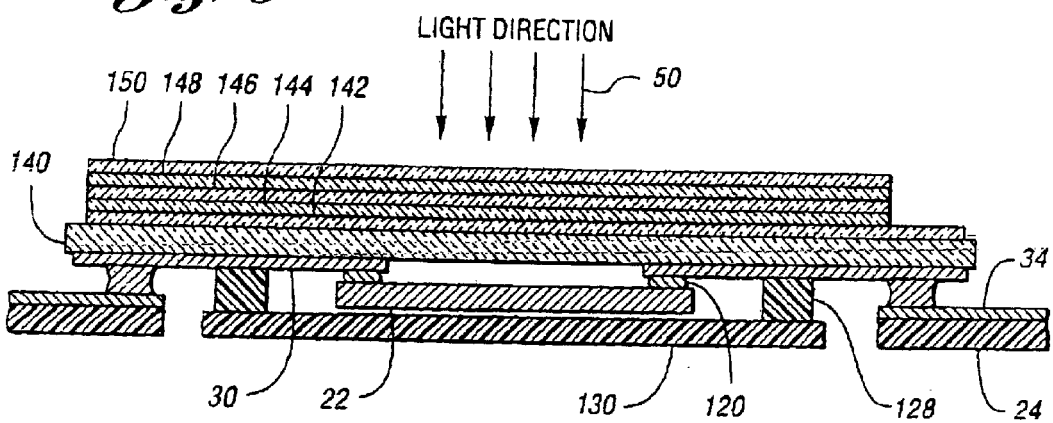
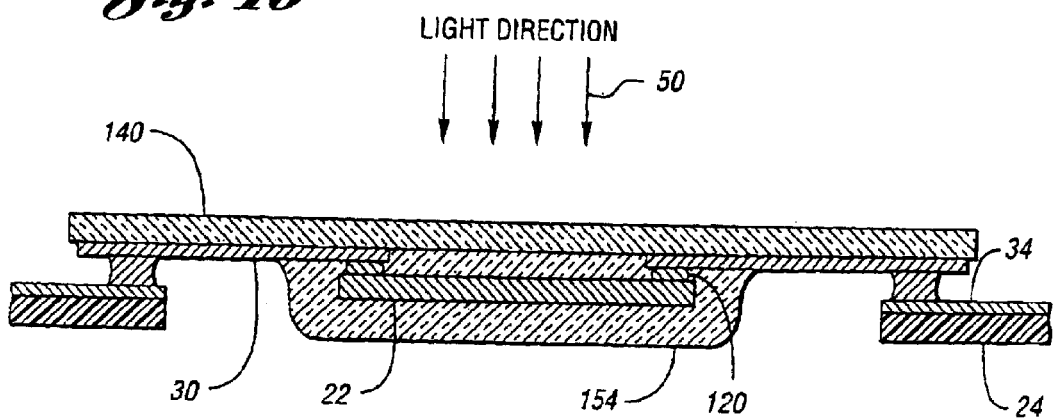

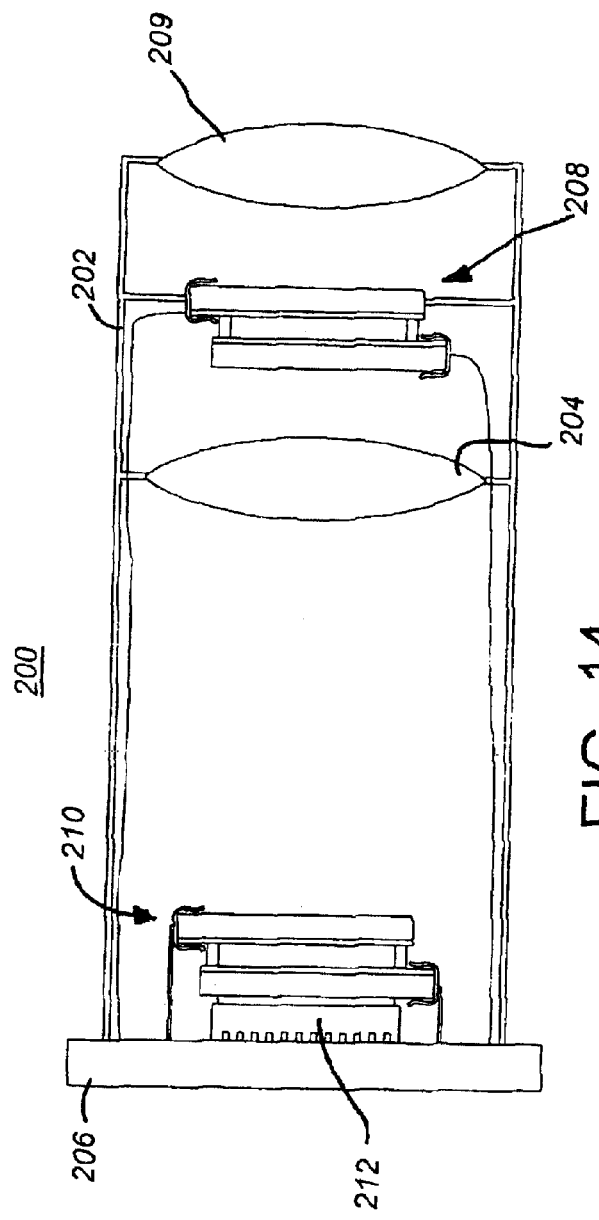

DEVICES INCORPORATING ELECTROCHROMIC ELEMENTS AND OPTICAL SENSORS

This application is a continuation of U.S. patent application Ser. No. 09/678,586 filed on Oct. 3, 2000, now U.S. Pat. No. 6,621,616, by Frederick T. Bauer et al. which is entitled "DEVICES INCORPORATING ELECTROCHROMIC ELEMENTS AND OPTICAL SENSORS". The present invention generally relates to electrochromic devices and devices incorporating electrochromic elements, such as devices incorporating both electrochromic elements and optical sensors, the disclosure of which is incorporated herein by reference.

BACKGROUND OF THE INVENTION

Variable transmittance light filters, such as electrochromic light filters, have been proposed for many uses including in architectural windows; skylights; rearview mirrors, windows, and sunroofs for automobiles; and in certain imaging systems. Such electrochromic light filters respond to a change in applied voltage by changing their transmittance. In general, it has been a goal of designers of electrochromic elements to configure the elements to vary transmittance uniformly across the whole element.

As noted above, electrochromic elements have been employed as light filters in imaging systems such as cameras. Examples of cameras utilizing electrochromic light filters are disclosed in U.S. Pat. Nos. 5,555,069, 5,387,958, 4,554,587, and 4,256,372. In each of these patents, the electrochromic light filter is spaced apart from the image recorder (i.e., the film or image sensor array) and exhibits substantially uniform transmittance levels. Such electrochromic light filters are used in combination with the mechanical irises that are commonly used in cameras to vary the exposure level of the film or image sensor array. Such conventional mechanical irises are either hand operated or operated by a motor in response to the detected illumination of the scene or object to be imaged. Although the electrochromic light filters can vary the exposure level of the image recorder, a conventional mechanical iris is required if the camera is to allow for the depth of field of the image to be adjusted.

Integrated circuit optical sensors are increasingly used to provide visual input for control systems as well as in cameras. Many applications place optical sensors in harsh environments, requiring that the sensors be enclosed in a protective package. Presently, commercial optical sensor packages are developed from conventional semiconductor packages incorporating clear plastic or add-on windows to conventional molded or ceramic devices including a lead frame. An example of such a device is disclosed in U.S. Pat. No. 5,861,654. These packaging assemblies are expensive and difficult to manufacture.

An optical sensor may be used in applications exposing the sensor to a range of light intensities beyond the dynamic range of the sensor. As an example, a configuration allowing the sensor to operate at low light levels may cause the sensor to wash out at a high light level. As another example, consider a scene illuminated by fluorescent lighting, which cycles in intensity with the alternating current supply. A pixel array sensor with a high scan rate will have portions of each frame illuminated by varying levels of light. To avoid this problem, an integration period of at least approximately 30 milliseconds must be used. Since the scan time is generally a multiple of the integration time, a camera set to 30 milliseconds scan period for a bright scene may result in an excessively long scan time for a dim scene. Further, particularly if a lens is used to focus light on the sensor, direct exposure to sunlight can generate sufficient heat to damage sensor elements. Applications where a camera or image sensor is likely to be exposed to sunlight for long periods of time include automotive headlight control systems such as that disclosed in commonly assigned U.S. patent application Ser. No. 09/528,389, entitled "IMPROVED VEHICLE LAMP CONTROL," and filed on Mar. 20, 2000; automotive moisture sensing systems such as that disclosed in commonly-assigned U.S. Pat. No. 5,923,027; and in automotive electronic vision systems such as those disclosed in commonly-assigned U.S. patent application Ser. No. 09/001,855, entitled "VEHICLE VISION SYSTEM," and filed on Dec. 31, 1997, and commonly-assigned U.S. patent application Ser. No. 09/153,654, entitled "SYSTEMS AND COMPONENTS FOR ENHANCING REAR VISION FROM A VEHICLE," and filed on Sep. 15, 1998. The disclosures of the above-noted patent and patent applications are incorporated herein by reference.

Mechanical and electromechanical shutters, when used, are not typically part of the optical sensor package. Electrically attenuated grayscale filters are never part of the commercial sensor device package, if available at all.

What is needed is a package for protecting an optical sensor that is inexpensive, compact, and easy to manufacture. The package should be adaptable to include an electronically controlled electrochromic variable attenuator.

SUMMARY OF THE INVENTION

An aspect of the present invention is to provide a structure enabling an electrochromic device to be readily mounted to a circuit board. To achieve this and other aspects and advantages, an electrochromic device of the present invention comprises a first substrate, an electrochromic medium disposed on the first substrate, a pair of electrodes in contact with the electrochromic medium, a pair of conductive clips, each in electrical contact with a respective one of the electrodes, and two pairs of electrical lead posts for mounting the first substrate to a circuit board, where each pair of lead posts is attached to, and extends from, a respective one of the conductive clips. According to another embodiment of the present invention, a device is provided that comprises an electrochromic element having a transmittance that varies in response to an electrical signal, a base substrate disposed in spaced relation to the electrochromic element, a seal disposed between the base substrate and the electrochromic element, such that the seal, base substrate, and electrochromic element form a sealed cavity therebetween. The device further comprises an optical sensor disposed on the base substrate within the sealed cavity.

Another aspect of the present invention is to provide an imaging device that does not require a mechanical iris. To achieve this and other aspects of the present invention, an imaging device of the present invention comprises an image recorder for recording a scene or object and an electrochromic element positioned between the image recorder and the object or scene to be imaged. The electrochromic element is configured to exhibit a non-uniform transmittance in response to an applied electrical signal.

It is an aspect of the present invention to provide a package for an optical sensor that is inexpensive and easy to manufacture. Another aspect of the present invention is to provide a package for an optical sensor that incorporates an electrically controlled variable attenuator. A further aspect of the present invention is to provide a method for encapsulating an optical sensor.

To achieve the above aspects and other aspects and features of the present invention, a package for encapsulating an integrated circuit optical sensor is described. The package is mountable on a support substrate. The sensor has a bottom surface and a top surface, the top surface comprising imaging electronics connected to a plurality of sensor bonding pads. The sensor bonding pads provide bonding points for connections off the sensor. The package includes a base substrate with a top surface and a bottom surface. The base substrate is constructed of an insulating material. The base substrate top surface has the optical sensor bottom surface bonded thereon. Conductive strips on the base substrate top surface extend from a region near the optical sensor to an edge of the base substrate top surface. Wires are bonded on one end to a sensor bonding pad for which connection is desired and on the other end to a corresponding conductive strip. A window is bonded to the base substrate top surface in a spaced-apart relationship by a seal material. The window admits light to the optical sensor. A means for connecting each conductive strip to a corresponding trace on the support substrate is also provided. The seal material extends around the sensor enclosing each wire but not enclosing any of the connecting means.

In one embodiment, the means for connecting each conductive strip to the corresponding trace on the support substrate includes a plurality of conductive clips, each clip having a connecting section, an opposing section, and at least one joining section joining the connecting section and the opposing section. The connecting section and the opposing section are separated by a distance less than the thickness of the base substrate. Each clip is placed on the base substrate such that the connecting section is in contact with one conductive strip and the opposing section is in contact with the base substrate bottom surface. In one refinement, the support substrate is a through-hole printed circuit board. Clips include a lead allowing the package to be mounted to the through-hole printed circuit board. In another refinement, the support substrate is a flexible circuit and each clip can be attached to the flexible circuit. In yet another refinement, clips can be surface mounted to the support substrate.

In another embodiment, the support substrate defines an opening of sufficient size to accept the window without accepting the entire base substrate. The means for connecting each conductive strip to a corresponding trace on the support substrate has conductive strips formed to provide clipless bonding points to corresponding traces on the support substrate bottom surface. The at least one conductive strip is positioned such that, when the at least one conductive strip is bonded to the corresponding trace, the window is inside the opening.

In still another embodiment, a cavity is formed by the base substrate, the window, and the seal material bonding the window and the base substrate. The cavity is filled with an optically transparent material. This material may be a transparent curable resin.

In yet another embodiment, the window is a first window. The package further includes a first transparent electrode on the top surface of the first window. A second window is bonded to the first window in a spaced-apart relationship by a seal material. The second window bottom surface has a second transparent electrode thereon. The first window, second window, and seal material bonding the second window to the first window form a cavity containing an electrochromic medium of variable transmittance. An electrochromic variable attenuator is formed by the first transparent electrode, the second transparent electrode, and the electrochromic medium, the electrochromic variable attenuator able to regulate the intensity of light admitted to the optical sensor.

In other embodiments, the window is coated with a film operative to affect the spectrum of light passing through the window and striking the optical sensor. Electro-optic and photochromic filters may be attached to the window. One or more lenses may be attached to the window or the window may be formed to function as one or more lenses.

A method for making the package is also provided. The method includes forming a base substrate from a nonconductive material. Conducting strips are deposited on the base substrate top surface, each strip extending from the region onto which the sensor will be attached to an edge of the base substrate top surface. The bottom surface of the sensor is adhered to the base substrate top surface. Wires are bonded between each sensor bonding pad and a corresponding conducting strip. A window is bonded to the base substrate top surface in a spaced-apart relationship using a seal material. The seal material encloses each wire but does not touch an edge of the base substrate top surface.

In one embodiment, the window is one substrate of an electrochromic variable attenuator.

In another embodiment, wherein the window is a first window, the method further includes depositing a first transparent electrode on the first window top surface. A second window is formed from a nonopaque material, the second window having a bottom surface with a second transparent electrode deposited thereon. The second window is bonded to the first window in a spaced-apart relationship using a seal material. A cavity is formed by the first window, the second window, and the seal material bonding the second window to the first window. At least one opening is formed in the cavity and the cavity is filled with an electrochromic medium. The opening is sealed. Electrical connections are attached to the first transparent electrode and the second transparent electrode.

Another package is provided for sensors with bonding pads capable of providing flip chip bonding points. The package includes a base substrate constructed of an insulating material. Conductive strips are on the base substrate bottom surface. The optical sensor top surface is flip chip bonded on the base substrate bottom surface such that each sensor bonding pad is connected to a corresponding conductive strip, each conductive strip extending to the edge of the base substrate. A means for connecting each conductive strip to a corresponding trace on the support substrate is also provided.

In one embodiment, the base substrate is transparent, admitting light to the imaging electronics.

In another embodiment, the base substrate is opaque. A hole in the base substrate permits the optical sensor imaging electronics to receive light. The package further includes a window bonded to the base substrate top surface in a spaced-apart relationship by a seal material. The seal material extends around the hole. The window therefore admits light to sensor imaging electronics.

In yet another embodiment, a cover is bonded to the base substrate bottom surface by a seal material in a spaced-apart relationship.

In a further embodiment, the optical sensor is coated with a transparent curable resin to provide environmental protection.

A method for making the package is also provided. The method includes forming a base substrate from a nonconductive material. Conducting strips are deposited on the base substrate bottom surface, each strip extending from the region onto which the sensor will be attached to an edge of the base substrate bottom surface. The sensor top surface is flip chip bonded to the base substrate bottom surface such that each sensor bonding pad is connected to a corresponding conductive strip.

An optical sensor with controlled light attenuation is also provided. The sensor includes an optical sensor assembly having an integrated circuit optical sensor disposed within a package, the package including a package window through which light strikes imaging electronics. A variable attenuator is bonded to the package surface in a spaced-apart relationship using a seal material extending around the package window.

The above objects and other objects, features, and advantages of the present invention are readily apparent from the following detailed description of the best modes for carrying out the invention when taken in connection with the accompanying drawings.

BRIEF DESCRIPTION OF THE DRAWINGS

In the drawings:

FIG. 8 is a cross-sectional view of an embodiment of the present invention using flip chip technology to attach the sensor to the base substrate;

FIG. 9 is a cross-sectional view of an embodiment of the present invention having a transparent base substrate and including a solid state electrochromic variable attenuator;

FIG. 10 is a cross-sectional view of an embodiment of the present invention using a transparent curable resin in place of the back cover;

FIG. 14 is a side partial cross-sectional view of an imaging device constructed in accordance with the present invention;

FIG. 15 is a side cross-sectional view of an electrochromic iris that may be used in the imaging device shown in FIG. 14;

FIG. 16 is a second embodiment of an electrochromic element that may be employed in the imaging device of FIG. 14.

DETAILED DESCRIPTION OF THE PREFERRED EMBODIMENTS

Referring now to FIGS. 1 through 5 and 8 through 17, drawings of embodiments of the present invention are shown. These drawings are not to scale and are provided to show the relationships amongst various elements used to construct the optical sensor package. Further, directional designations such as top and bottom are used for clarity of explanation and are not meant to restrict the present invention to any particular orientation.

Figure 1:
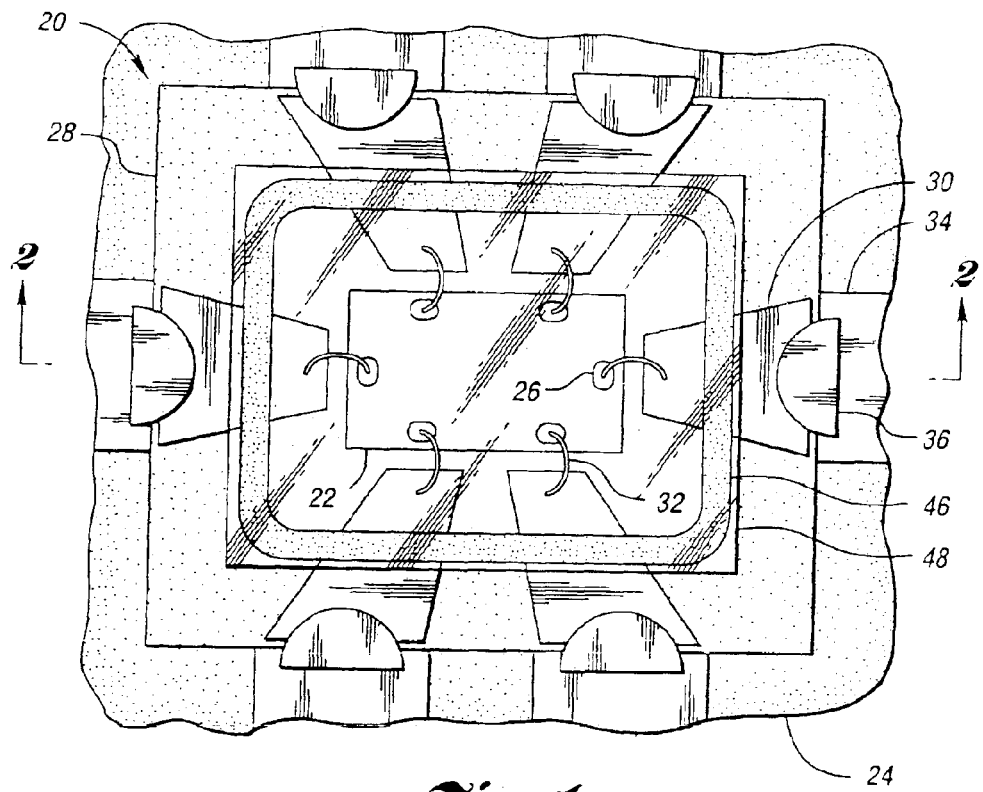
FIG. 1 is an overhead view of an embodiment of an optical sensor enclosure according to the present invention.
Figure 2:
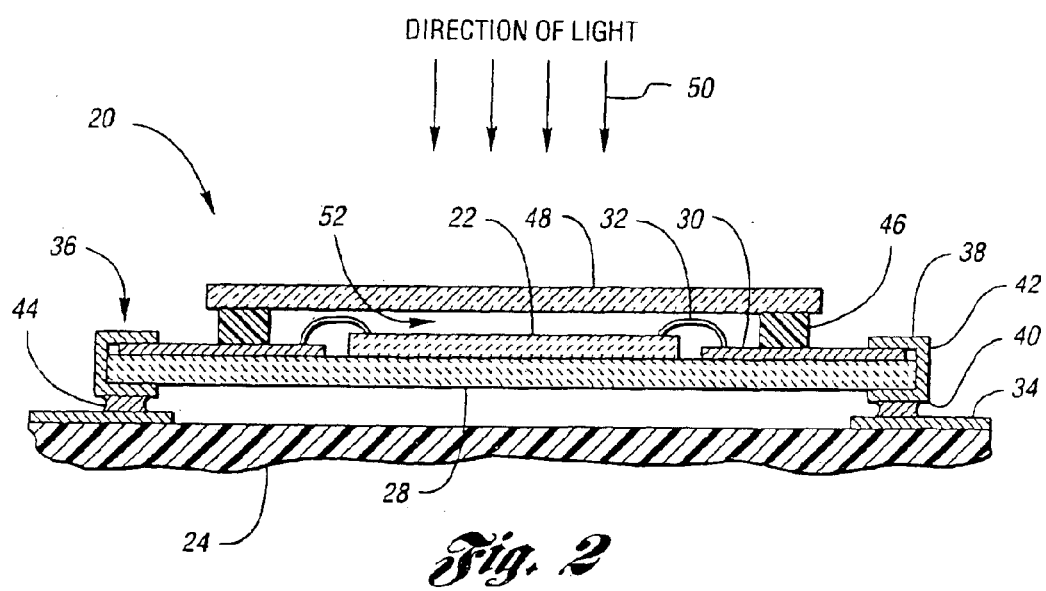
FIG. 2 is a cross-sectional view of the enclosure shown in FIG. 1.

Referring now to FIG. 1, an overhead view, and to FIG. 2, a cross-sectional view, an embodiment of the present invention is shown. An enclosure assembly 20 is provided to encapsulate an optical sensor 22. Enclosure assembly 20 is designed to be mounted on a support substrate 24 which may be, for example, a printed circuit board, flexible circuit, ceramic substrate, or the like.

Optical sensor 22 is an integrated circuit chip. Optical sensor 22 may be, for example, an image sensor including an array of pixel sensors and support electronics. Light sensitive imaging electronics, such as pixel sensors, are constructed on the top side of optical sensor 22. Imaging electronics are connected to sensor bonding pads 26 that provide bonding points for connections off the sensor. Bonding pads 26 are not shown in cross-sectional views for clarity.

In the embodiment shown in FIGS. 1 and 2, optical sensor 22 is attached to the top side of a base substrate 28 by adhering the bottom side of optical sensor 22 to base substrate 28. Base substrate 28 may be constructed from a nonconducting material such as glass or ceramic.

Conductive strips, one of which is indicated by 30, conduct signals and supply voltages between optical sensor 22 and the edge of base substrate 28. A wire 32 connects pads on optical sensor 22 with conductive strips 30. A means for connecting each conductive strip 30 with a corresponding trace 34 on support substrate 24 is provided. Various means are discussed with regards to FIGS. 1 through 4.

Figure 3:
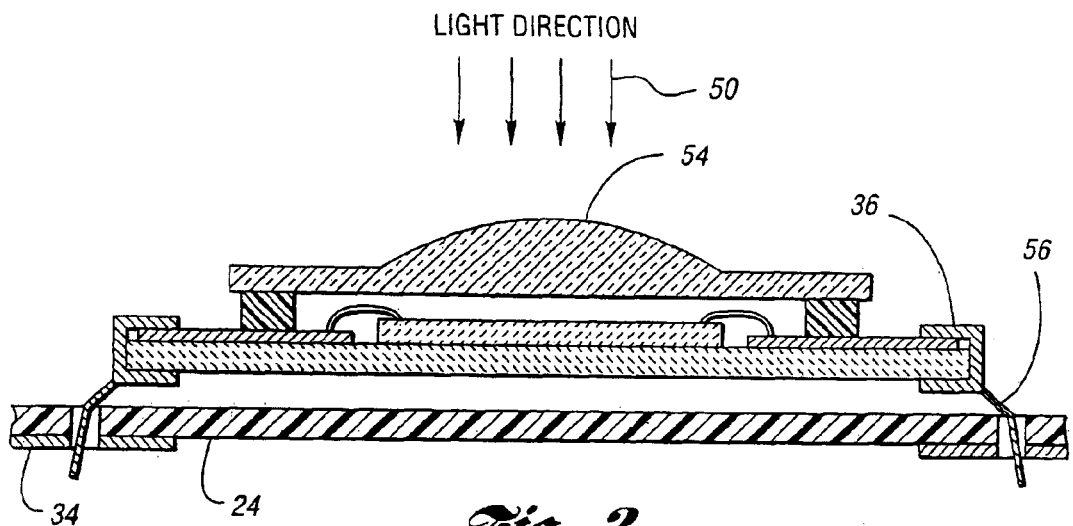
FIG. 3 is a cross-sectional view of an embodiment of the present invention in which the window is formed as a lens.

Several means for connecting each conductive strip 30 with a corresponding trace 34 on support substrate 24 use conductive clips, such as C-clips, U-clips, or the like, one of which is shown by 36. Clip 36 has a connecting section 38, an opposing section 40, and a joining section 42 having at least one curved section joining con section 38 and opposing section 40 such that connecting section 38 and opposing section 40 are separated by a distance less than the thickness of base substrate 28. Clip 36 is slid onto the edge of base substrate 28 such that connecting section 38 is in contact with conductive strip 26 and opposing section 40 is in contact with base substrate 28 bottom surface. In the embodiment shown in FIG. 2, clip 36 is formed to allow enclosure assembly 20 to be reflow soldered as a surface mount part, forming a solder joint 44. In an alternate embodiment, a lead is formed as part of clip 36 allowing enclosure assembly 20 to be mounted on a through-hole printed circuit board. Clip 36 with a lead is shown in FIG. 3. Clip 36 can be modified to support various techniques for mounting enclosure assembly 20 to support substrate 24. Suitable clips are available from NAS Interplex of Flushing, N.Y.

A seal material 46 surrounds optical sensor 22, enclosing each wire 32. Seal material 46 is placed far enough from the edge of base substrate 28 that seal material 46 does not interfere with the assembly of clip 36 onto base substrate 28. A window 48 is bonded to base substrate 28 in a spaced-apart relationship, the spacing distance determined by seal material 46. Window 48 allows light rays 50 to strike imaging electronics on optical sensor 22. Base substrate 28, seal material 46, and window 48 form a cavity 52 containing optical sensor 22.

Spacing provided by seal material 46 may be accomplished in a variety of manners. A single polymer collar surrounding optical sensor 22 may be used. Alternately, a plurality of posts may be distributed around optical sensor 22. A sealant may be applied to either the collar or the posts. Preferably, seal material 46 is a combination of a sealant material and a spacing material. The sealant material may be epoxy resin, silicones, rubber cement, low melting temperature glass, certain plastics, paraffin wax, or the like. The spacing material may be small glass beads, nylon monofilament, MYLAR® strips, polystyrene beads, or the like. A preferred seal material 46 is a mixture of glass beads with epoxy resin sealant.

Window 48 may be glass or plastic and may be transparent or nearly transparent (nonopaque). Window 48 may be coated with one or more films to transmit or reject portions of the spectrum of light rays 50. Window 48 may also be manufactured with dyes or fillers within window 48 to allow filtering of light rays 50.

In an embodiment of the present invention, base substrate 28, seal material 46, and window 48 form a hermetically sealed enclosure around optical sensor 22. In another embodiment, cavity 52 is filled with an optically transparent curable resin such as epoxy. The resin may be self curing or may be cured by exposure to heat, ultraviolet light, an electron beam, or the like.

Mechanisms for reducing the intensity of light reaching optical sensor 22 may be attached to or formed on window 48. Window 48 may be coated with a photochromic material. Various electro-optic variable attenuators may be placed in front of window 48 such as liquid crystal devices, dipolar suspension devices, electrophoretic devices, suspended particle devices such as those available from Research Frontiers Inc. of Woodbury, N.Y., electrochromic devices, and the like.

Electrochromic devices contain an electrochromic medium which darkens in response to an applied voltage. The electrochromic medium includes electroactive cathodic and anodic materials that may be independently chosen from at least the categories of solution-phase, surface-confined, and deposition.

In solution-phase media, a material is contained in solution in an ionically conducting electrolyte. The material remains in solution when electrochemically reduced or oxidized. Solution phase electroactive materials may be contained in the continuous solution phase of a free-standing gel as described in U.S. Pat. No. 5,928,572 entitled "ELECTROCHROMIC LAYER AND DEVICES COMPRISING SAME" by W. L. Tonar et al. which is hereby incorporated by reference.

In surface-confined or solid state media, a material is attached directly to an electrically conducting electrode or confined in close proximity thereto. The material remains attached or confined when electrochemically reduced or oxidized.

In electrodeposition, a material confined in solution in an ionically conducting electrolyte forms a layer on the electrically conducting electrode when electrochemically reduced or oxidized.

A variety of materials that may be used to construct an electrochromic device are described in U.S. Pat. No. 6,020,987 entitled "ELECTROCHROMIC MEDIUM CAPABLE OF PRODUCING A PRE-SELECTED COLOR," by K. Baumann et al. which is hereby incorporated by reference.

Referring now to FIG. 3, a cross-sectional view of an embodiment of the present invention in which the window is formed as a lens is shown. Window 48 may be constructed to incorporate one or more lenses as shown by window 54. A lens may be formed on the top surface, bottom surface, or both surfaces of window 54. Also, window 54 may be an assembly, allowing multiple lenses of differing material to be placed over optical sensor 22. Further, one or more lenses may be attached to window 48 to create window 54.

FIG. 3 also shows clip 36 with an attached pin 56, allowing enclosure assembly 20 to be mounted on through-hole printed circuit board support substrate 24. Clip 36 with attached pin 56 may be of the type known as SOLLOK from Berg Electronics of Etters, Pa.

Figure 4:
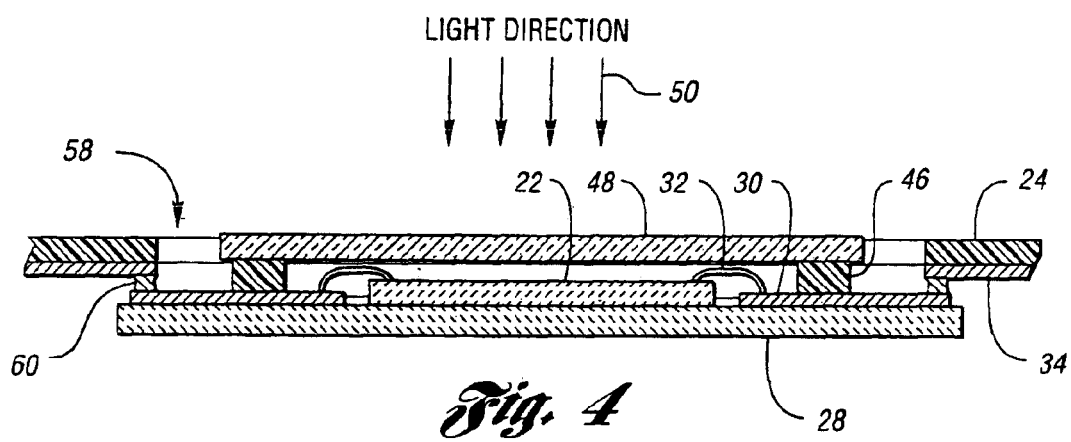
FIG. 4 is a cross-sectional view of an embodiment of the present invention using a clipless technology to directly connect conductive strips to traces on the support substrate.

Referring now to FIG. 4, a cross-sectional view of an embodiment of the present invention using a clipless technology to directly connect conductive strips to traces on the support substrate is shown. As an alternative to using clip 36, base substrate 28 may be mounted to support substrate 24 using a clipless technology. Support substrate 24 defines an opening, shown generally by 58, of sufficient size to accept window 48 without allowing base substrate 28 to pass through. The means for connecting each conductive strip 30 to the corresponding trace 34 on supporting substrate 24 includes forming conductive strip 30 to provide a clipless bonding point to the corresponding trace 34 on support substrate 24. Any suitable clipless technology may be used.

In one embodiment, a solder paste 60 is deposited on a wettable region of conductive strip 30. A matching solder wettable terminal footprint is made on trace 34. Base substrate 28 is aligned to support substrate 24 and all solder joints are made simultaneously by reflowing solder paste 60.

Figure 5:
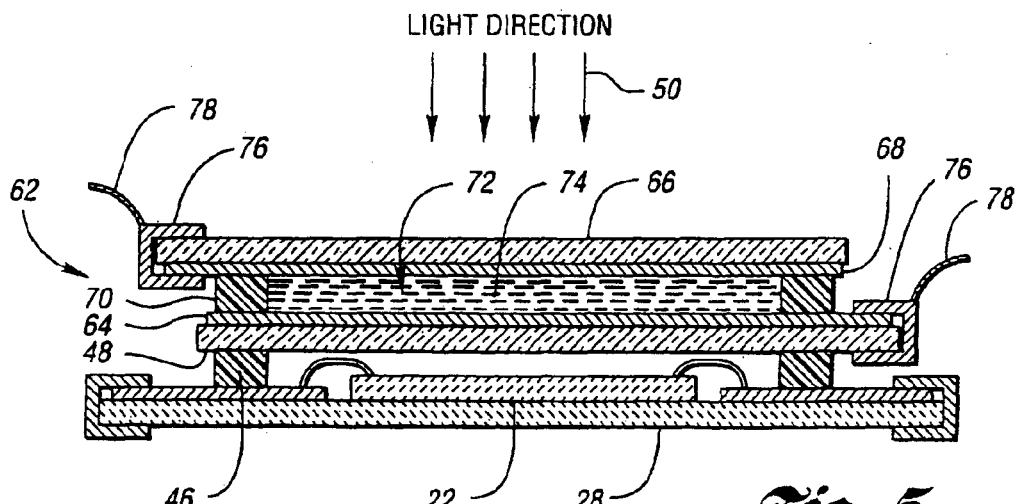
FIG. 5 is a cross-sectional view of an embodiment of the present invention that includes an electrochromic variable attenuator.

Referring now to FIG. 5, a cross-sectional view of an embodiment of the present invention that includes a solution-phase electrochromic variable attenuator is shown. An electrochromic variable attenuator, shown generally by 62, is operative to vary transmittance of light in response to an electrical signal. The operation and construction of an electrochromic device that may be used as electrochromic variable attenuator 62 is described in U.S. Pat. No. 4,902,108 entitled "SINGLE-COMPARTMENT, SELF-ERASING, SOLUTION-PHASE ELECTROCHROMIC DEVICES, SOLUTIONS FOR USE THEREIN, AND USES THEREOF," to H. J. Byker and hereby incorporated by reference.

Electrochromic variable attenuator 62 comprises two nonopaque conductors, referred to as transparent conductors, separated by a reversible variably transmittant solution. First window 48, onto the top surface of which is deposited a first transparent electrode 64, forms the first conductor. A second window 66, onto the bottom surface of which is deposited a second transparent electrode 68, forms the second conductor. First window 48 and second window 66 are bonded together in a spaced-apart relationship by a seal material 70. First window 48, second window 66, and seal material 70 form a cavity 72, which contains an electrochromic medium 74.

First window 48 and second window 66 may be constructed of glass or plastic. Window 48, 66 may be coated with one or more barrier coatings to protect the plastic from the electrochromic materials, reduce abrasion, and reduce the transmission of contaminants such as moisture and oxygen. Window 48, 66 may also be coated to reduce glare, transmit certain spectra, or reject unwanted spectra. The coatings can be transparent, partially transparent, conductive, or partially conductive as required by the function of optical sensor 22. Window 48, 66 may be also be filled with a dye to provide desired filtering properties. A thickness for each substrate of between 0.05 cm and 1.0 cm may be used with a thickness between 0.10 cm and 0.21 cm preferred.

First transparent electrode 64 and second transparent electrode 68 may be made of any conductive material that will adhere to the surface of first window 48 and second window 66, that will transmit light, and that will not cause significant degradation of electrochromic medium 74. Possible materials include transparent layers of gold, tin oxide, ruthenium oxide, cadmium stannate, zinc sulfate, and, preferably, indium-doped tin oxide (ITO). First transparent electrode 64 and second transparent electrode 68 will preferably cover the entire surface of first window 48 and second window 66, respectively, within cavity 72 and extend outside of cavity 72 into a region on which a connection can be made.

Seal material 70 can be of the same construction as seal material 46. In particular, a mixture of small glass beads in an epoxy resin sealant may be used. Further seal materials are described in Byker.

Electrochromic medium 74 preferably comprises a solvent, at least one cathodic electrochromic compound, and at least one anodic electrochromic compound. An inert current-carrying electrolyte may be added if all cathodic and anodic compounds in their zero-potential equilibrium states are not ionic in solution 74. Preferably, solution 74 may be gelled or thickened with a cross-linked polymer matrix such as IEMA/MMA cross-linked with a dial as described in Tonar et al., U.S. Pat. No. 5,928,572. A large number of combinations of solvents, cathodic electrochromic compounds and anodic electrochromic compounds may be used, as described in Byker. One such combination is a solution of 0.05 M 1,1'-dibenzyl-4,4'-bipyridinium difluorborate and 0.05 M 5,10-dihydro-5,10-dimethylphenazine in propylene carbonate.

Connections to electrodes 64, 68 are required. In a preferred embodiment, first transparent electrode 64 extends to an edge of first window 48 and second transparent electrode 68 extends to an edge of second window 66. A clip 76 is attached to each window 48, 66 in contact with the respective electrode 64,68. Clip 76 may be of the type described in U.S. Pat. No. 6,064,509 entitled "CLIP FOR USE WITH TRANSPARENT CONDUCTIVE ELECTRODES IN ELECTROCHROMIC DEVICES" by W. Tonar et al., which is hereby incorporated by reference. A wire 78, attached to clip 76, supplies a control signal to the respective electrode 64, 68. In an alternative embodiment, an exposed strip of each electrode extends beyond cavity 72. A conductive strip or wire is attached to the exposed strip and extends beyond the edge of the corresponding window 48, 66. This embodiment is further described in the above patent to Byker.

In an alternative embodiment of the present invention, connections to clips 36, 76 are through flexible printed circuits. Clip 36, 76 may be bonded to a flexible printed circuit using an existing technology such as, for example, chip-on-flex by HEI Inc., which supports both chip and wire as well as flip chip flexible printed circuit connection technologies.

Figure 12:
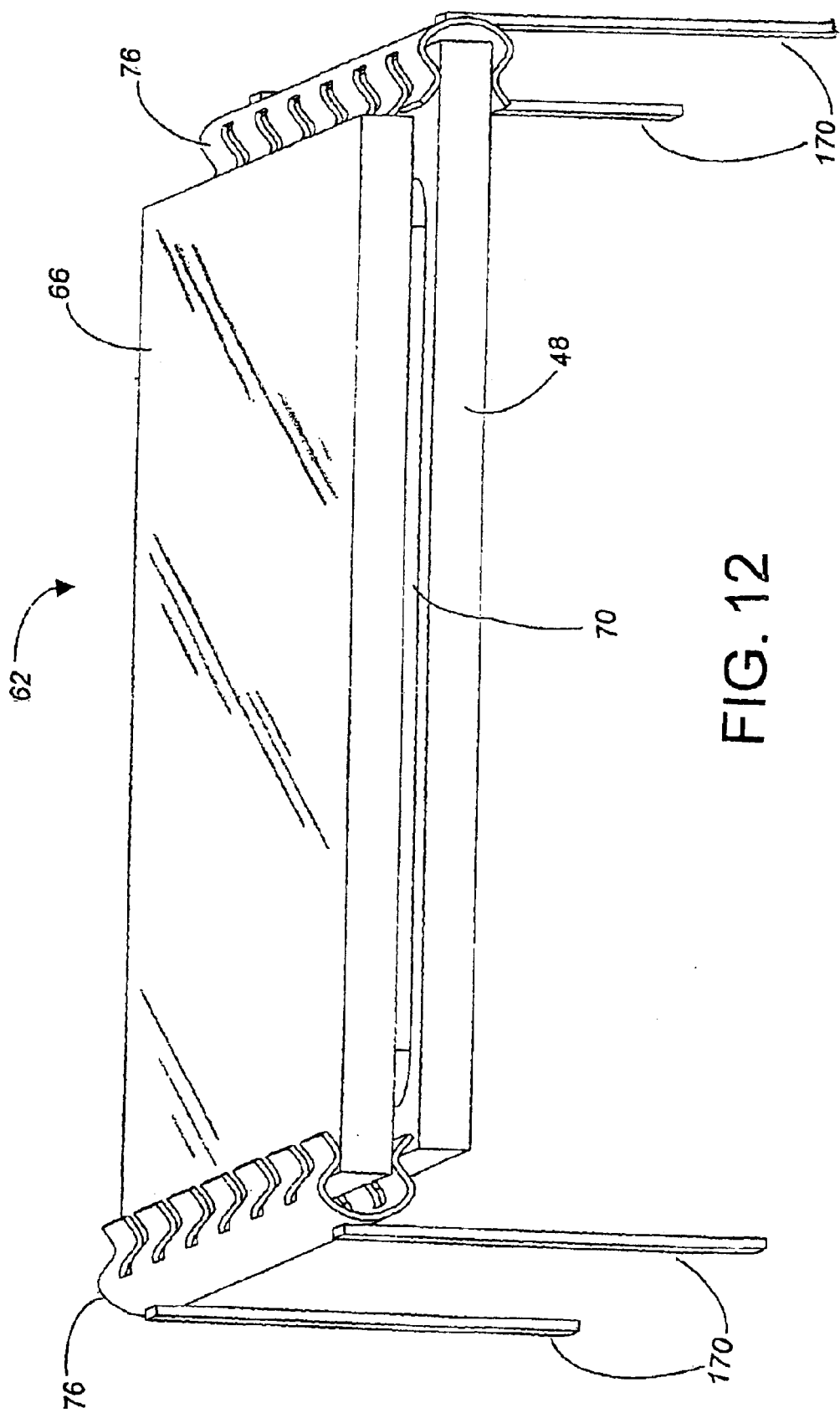
FIG. 12 is a perspective view of an electrochromic variable attenuator constructed in accordance with the present invention.
Figure 13:
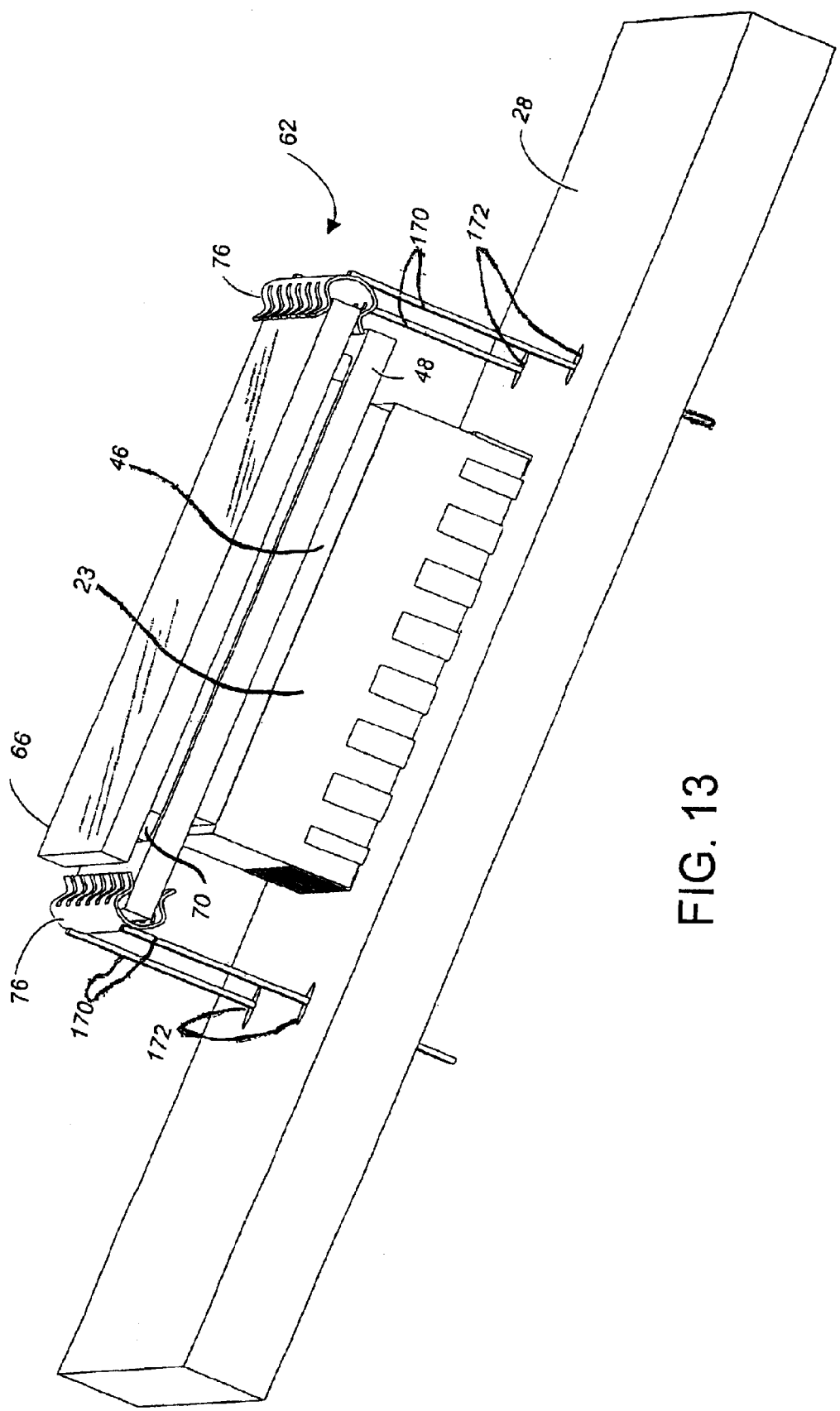
FIG. 13 is a perspective view of an embodiment of an image sensor package of the present invention that includes the electrochromic variable attenuator shown in FIG. 12.
Figure 17:
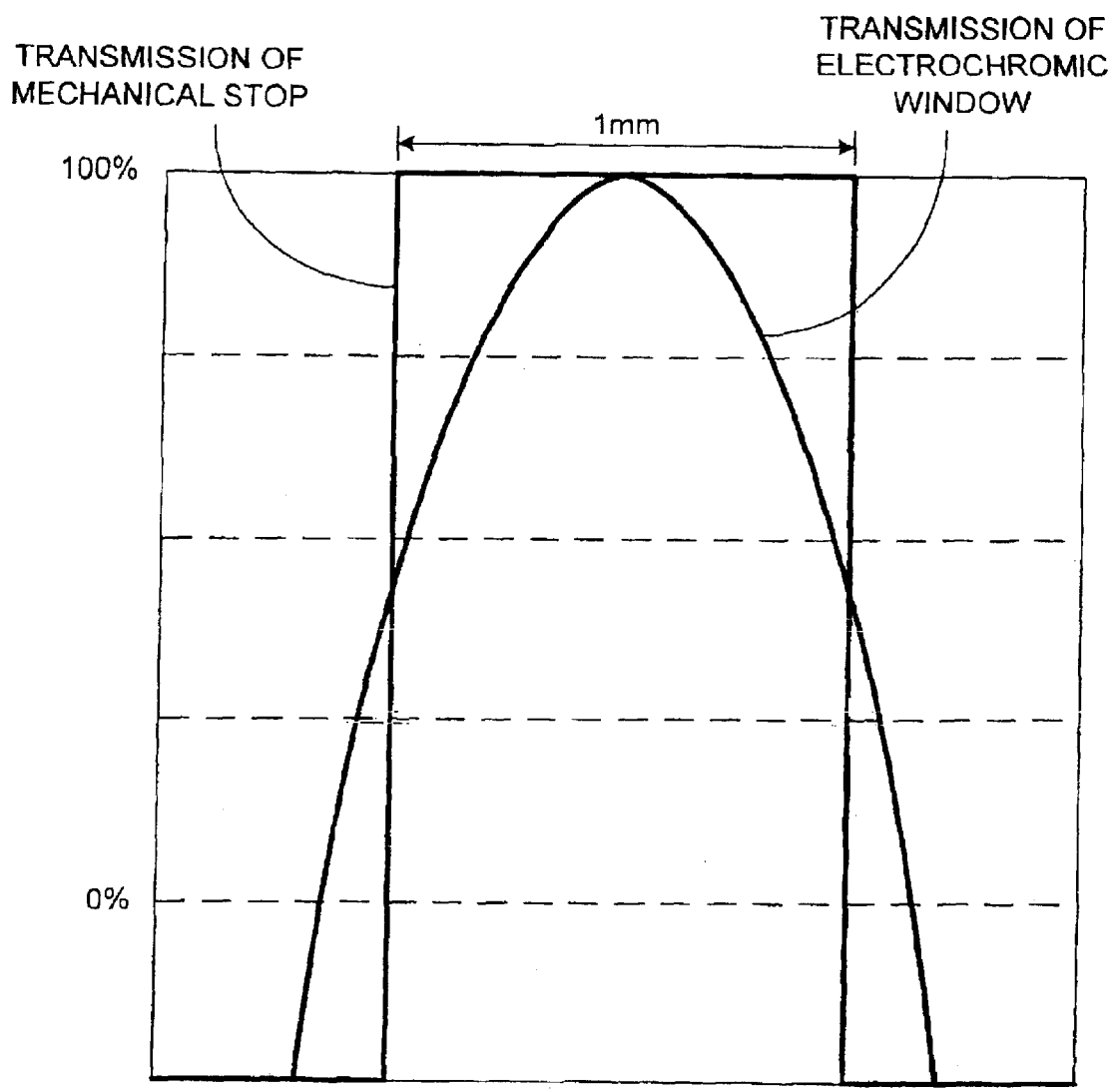
FIG. 17 is a plot of the intensity of the light passing through a mechanical iris and the light passing through an electrochromic iris as a function of its radius.

FIGS. 12 and 13 illustrate an alternative configuration to that shown in FIG. 5. Specifically, rather than utilizing loose wires to connect to clip 76 of electrochromic filter 62, pairs of lead posts 170 are secured to opposite ends of each clip 76 in such a manner that lead posts 170 effectively extend from opposite corners of electrochromic device 62. As shown in FIG. 13, lead posts 170 allow the electrochromic device to be mounted on through-hole printed circuit board 28 with lead posts 170 extending through holes 172. As best shown in FIG. 13, an image sensor package 23 may be mounted to printed circuit board 28 with a seal 46 disposed on top of image sensor package 23. Electrochromic device 62 may be mounted above sensor package 23 and pressed onto seal 46 after image sensor package 23 has been mounted. Alternatively, sensor package 23 and electrochromic device 62 may be preassembled into a single package and then attached to circuit board 28.

Lead posts 170 may be attached to clips 76 by welding, soldering, or any other known technique. Although lead posts 170 are illustrated as having uniform thickness and width throughout their length, it will be appreciated by those skilled in the art that lead posts 170 may have bumps or protrusions to serve as stops for limiting the depth of insertion of posts 170 in through-holes 172.

Although electrochromic device 62 is shown as used in combination with an image sensor package 23 in FIG. 13, it will be appreciated by those skilled in the art that electrochromic device 62 as shown in FIG. 12 may be separately mounted on a printed circuit board in applications where this may be desired.

Figure 6:
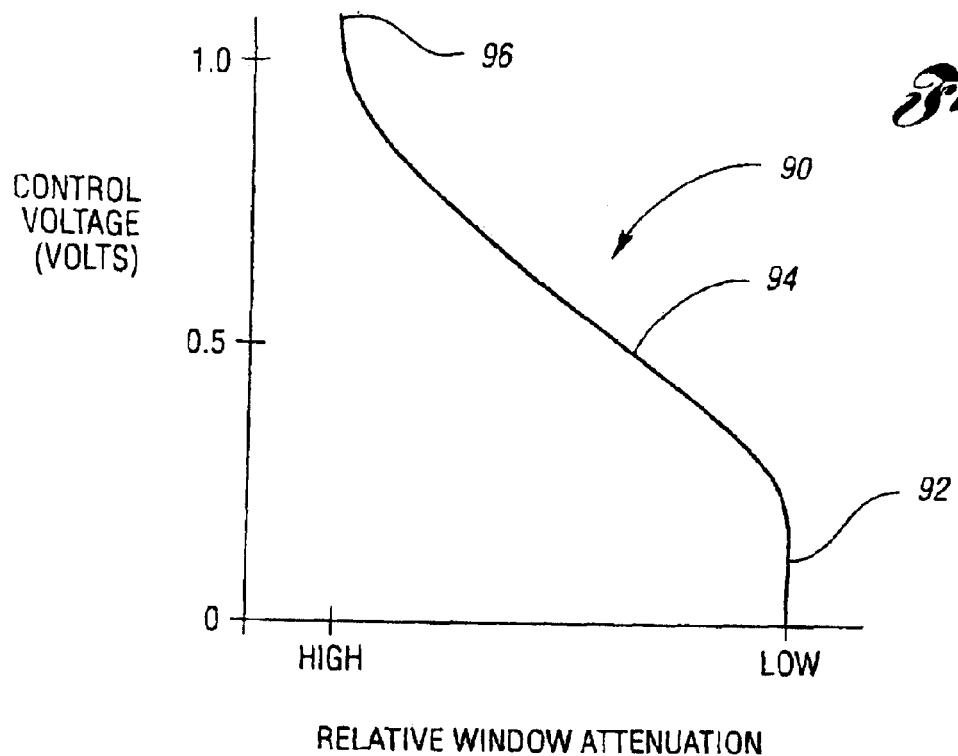
FIG. 6 is a graph showing the control characteristics of an electrochromic variable attenuator.

Referring now to FIG. 6, a graph showing the control characteristics of electrochromic variable attenuator 62 is shown. The curve, shown generally as 90, indicates increasing attenuation along the decreasing vertical axis. When the voltage between electrodes 64, 68 is low, accomplished by shorting electrodes 64, 68 together or by allowing solution 74 to self discharge, the attenuation is low. As depicted by curve section 92, when the control voltage applied across electrodes 64, 68 increases from 0 to approximately 0.35 volts, electrochromic variable attenuator 62 becomes slightly attenuating. As control voltage is increased, the attenuation increases smoothly with increasing control voltage as shown by curve section 94. A maximum attenuation is achieved when the applied control voltage is a little over one volt, as shown in curve section 96. Curve 90 indicates that electrochromic variable attenuator 62 can provide a variable level of attenuation.

The characteristic shown by curve 90 is typical of a fairly wide class of solution phase electrochromic devices, is reasonably reproducible from one unit to another, and is reasonably stable with temperature. However, temperature compensation may optionally be included in using the voltage setting to control the attenuation of electrochromic variable attenuator 62.

By adjusting the chemical composition of solution 74 and the distance through which light must travel through solution 74, defined by the height of cavity 72, the maximum attenuation attainable by electrochromic variable attenuator 62 is adjustable over a wide range. Increasing the concentration of solution 74 or height of cavity 72 in general increases the maximum attenuation.

In an alternative embodiment of the present invention, a variable attenuator is bonded to the top of a standard optical sensor. Enclosure assembly 20 is replaced with a commercially available optical sensor such as, for example, the Photobit PB-100. Such sensors have a package window through which imaging electronics can view a scene. A variable attenuator, such as a liquid crystal window, a solid state electrochromic window or, preferably, electrochromic variable attenuator 62, is attached in front of the package window. The variable attenuator is bonded to the standard optical sensor in a spaced-apart relationship by a seal material such as seal material 46.

Figure 7:
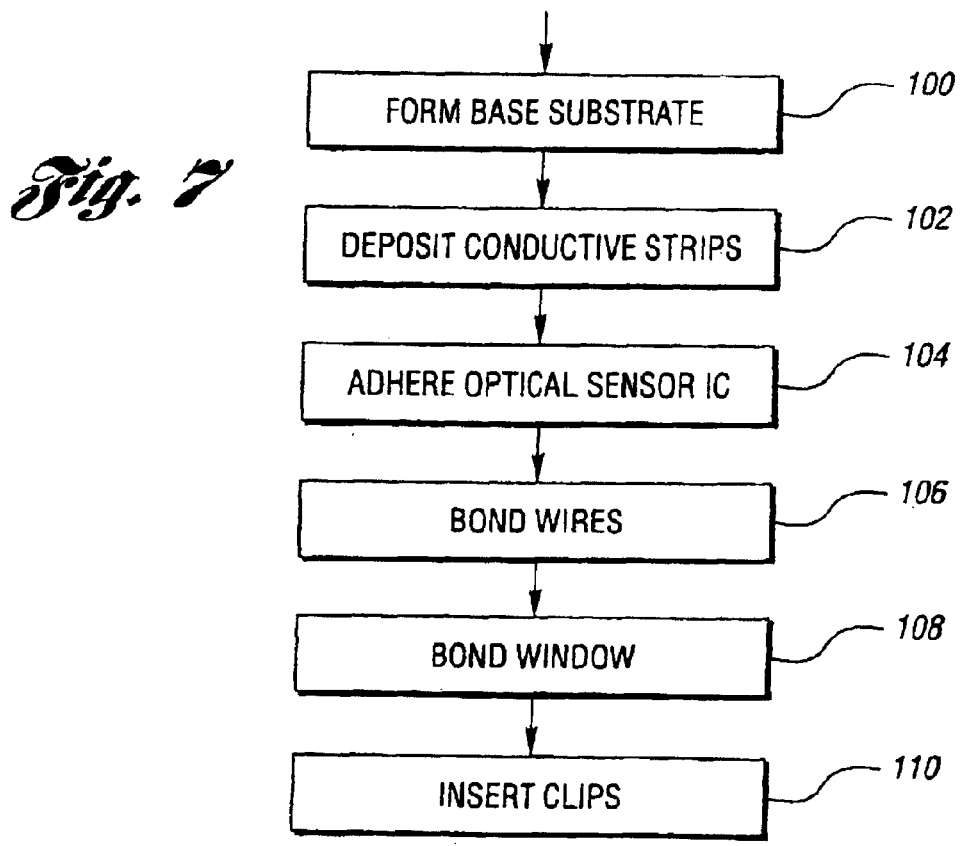
FIG. 7 is a flow diagram showing a process for making an embodiment of the present invention.

Referring now to FIG. 7, a flow diagram of a manufacturing process according to the present invention is shown. As will be appreciated by one of ordinary skill in the art, the operations illustrated are not necessarily sequential operations.

Base substrate is formed in block 100. If glass is used, base substrate 28 may be formed from a large sheet of glass having the desired substrate thickness. The glass sheet can be scored or scribed with a set of horizontal and vertical lines using a diamond wheel or the like. The glass sheet is then broken along the scribed lines with spacing between lines determining the surface size of base substrate 28.

Conductive strips are deposited in block 102. Various photolithographic techniques may be used. In one embodiment, a mask is formed on the top surface of base substrate 28 having openings over each area on which conducting strips 26 will be deposited. One or more conducting materials or a combination of conducting materials, such as gold, platinum, copper, aluminum or chrome rhodium, is sputtered onto the substrate top surface. The mask is then removed leaving conductive strips 30. In another embodiment, a conducting material is deposited on the top surface of base substrate 28. A mask is formed on the conducting material, the mask covering areas on which each conductive strip 30 will be formed. Base substrate 28 is then exposed to an etchant that dissolves the conducting material not covered by the mask without substantially attacking the material protected by the mask. The mask is removed leaving conductive strips 30. In yet another embodiment, a conductor formed of successive layers of chrome, rhodium, and gold is formed on the surface of base substrate 28. Regions of the conductor are selectively removed with a Nd:YAG laser leaving conductive strips 30. In still other embodiments, conductive strips 30 may be screened and fired or cured.

The optical sensor is adhered to the base substrate in block 104. The bottom surface of optical sensor 22 is bonded to base substrate 28. Techniques for bonding an integrated circuit optical sensor 22 to glass or ceramic base substrate 28 are well known to one of ordinary skill in the art of packaging integrated circuits.

Wires are bonded in block 106. Wire 32 is used to connect sensor bonding pad 26 on optical sensor 22 with a corresponding conductive strip 26. Methods for bonding wires between pads and metal strips are well known in the art of integrated circuit manufacturing.

The window is bonded in block 108. A bead of seal material 46 is made on the top surface of base substrate 28 around the periphery of bonded wires 32. Seal material 46 is placed far enough from the edge of base substrate 28 so as not to interfere with the installation of clips 30 or with clipless bonding of base substrate 28 to support substrate 24. Window 48 is pressed onto seal material 46. In a preferred embodiment, seal material 46 includes an epoxy sealant which can be thermal cured or cured by exposure to ultraviolet light. For thermally cured seals, the package is heated prior to bonding window 48 onto base substrate 28 to prevent pressure build up due to expanding gas within cavity 52.

In an embodiment of the present invention, the seal formed between base substrate 28 and window 48 is a hermetic seal. In a preferred embodiment, window 48 can be separated from base substrate 28 by distances ranging between approximately 0.0025 cm and approximately 0.05 cm. In an embodiment, cavity 52 formed by base substrate 28, seal material 46, and window 48 is partially or completely filled with a transparent curable resin.

In an embodiment of the present invention, clips are inserted in block 110. Base substrate 28 extends beyond window 48, exposing portions of conductive strips 30. U- or C-shaped clips 36 are placed on base substrate 28. Each clip 36 has a conductive portion in contact with a corresponding conductive strip 30 and an opposing portion in contact with the bottom surface of base substrate 28. Clip 36 may be soldered to conductive strip 30 to increase adhesion and improve electrical conduction.

In an embodiment of the present invention, window 48 is a substrate of an electro-optic attenuator such as electrochromic variable attenuator 62. The operation of placing the window in block 108 installs the electro-optic attenuator into enclosure assembly 20. Additional constructions that may be used to implement an electrochromic variable attenuator that may be used as an electro-optic attenuator are described in the above referenced patent to Byker.

In an alternative embodiment, electrochromic variable attenuator 62 is built onto window 48. First window 48 and second window 66 are formed prior to assembly. If constructed of glass, window 48, 66 can be made in a manner similar to that used to make base substrate 28. First transparent electrode 64 and second transparent electrode 68 are formed on first window 48 and second window 66, respectively. Preferably, an optically transparent layer of metal or a metal alloy is deposited onto the substrate. This deposition may occur prior to cutting the substrate pieces or after forming windows 48, 66. The sheet resistance of electrodes 64, 68 should be less than 100 ohms per square and, preferably, less than 40 ohms per square. The electrodes do not have to cover the entire surface of windows 48, 66.

Second window 66 is bonded to first window 48 in a spaced-apart relationship using seal material 70. First window 48 is positioned such that first transparent electrode 64 is on the top surface of first window 48. Second window 66 is positioned such that second electrode 68 is on the bottom surface of second window 66. Bonding first window 48 to second window 66 may be accomplished in the same manner that first window 48 is bonded to base substrate 28 as described in block 108. Also, seal material 70 may have the same construction as described for seal material 46.

Two holes are drilled in second window 66. Electrochromic medium 74 is poured into cavity 72 through one hole while air escapes through the other hole. Cavity 72 may be completely filled or may be substantially filled to allow room for expansion. The two holes are plugged, first with a thermoplastic material inert to electrochromic medium 74 then with a sealant such as epoxy.

Referring now to FIG. 8, a cross-sectional view of an embodiment of the present invention implemented using a flip chip technology is shown. The top of optical sensor 22 is directly flip chip bonded to the bottom of base substrate 28. Base substrate 28 is inverted with respect to the views provided in FIGS. 2 through 5 above in order to consistently show the light direction coming from above. Hence, what was referred to as the top of base substrate 28 in FIGS. 1 through 5 and FIG. 7 becomes the bottom of base substrate 28 in FIGS. 8 through 11. In one embodiment, a solder bump 120 joins sensor bonding pad 26, not shown for clarity, with a matching footprint on conductive strip 30.

In the embodiment shown in FIG. 8, base substrate 28 is not transparent. Base substrate 28 includes a hole 122. Optical sensor 22 is mounted on base substrate 28 such that imaging electronics on optical sensor 22 are positioned to accept light rays 50 through hole 122.

In an embodiment of the present invention, a seal material 124 surrounds hole 122. A window 126 is bonded to base substrate 28 top surface in a spaced-apart relationship using seal material 124. Seal material 124 and window 126 may be constructed in manners described for seal material 46 and window 48, respectively, in FIGS. 1 through 7 above. Similarly, window 126 may be used in place of window 48 in all embodiments described with regards to FIGS. 1 through 7 above.

In an another embodiment of the present invention, a seal material 128 and a cover 130 are included to protect the back side of optical sensor 22. In this embodiment, cover 130 is preferably opaque. Seal material 128 and cover 130 may be constructed as described for seal material 46 and window 48 with regards to FIGS. 1 through 7 above.

Referring now to FIG. 9, a cross-sectional view of an embodiment of the present invention having a transparent base substrate is shown. A transparent base substrate 140 admits light rays 50 onto imaging electronics on optical sensor 22. This embodiment eliminates the need for hole 122, seal material 124, and window 126.

Transparent base substrate 140 may be used as window 48 in the various embodiments and options described with regards to FIGS. 1 through 7 above. For example, electrochromic variable attenuator 62 may be built using transparent base substrate 140 as first window 48 or an electro-optic attenuator, such as electrochromic variable attenuator 62, may be attached to the top of base substrate 140. Also, transparent base substrate 140 may be formed as one or more lens 54, may support one or more lens, may be coated with films, and may incorporate dyes or fillers.

Transparent base substrate 140 may also be used as the substrate of a solid state electrochromic attenuator. This embodiment is shown in FIG. 9. The top surface of transparent base substrate 140 is coated with a first transparent electrode 142. A cathodic electrochromic layer 144 is built on first transparent electrode 142. Cathodic electrochromic layer 144 may be comprised of a solid state cathodic material such as, for example, $WO_3$. A lithium-containing polymeric electrolyte layer 146 is built on cathodic electrochromic layer 144. An anodic electrochromic layer 148 is built on polymeric electrolyte layer 146. Anodic electrochromic layer 148 may be comprised of oxides of nickel, titanium, cerium, iridium, or the like. A second transparent electrode 150 is built on anodic electrochromic layer 148. First transparent electrode 142 and second transparent electrode 150 may be comprised of gold, tin oxide, ruthenium oxide, cadmium stannate, zinc sulfate, indium-doped tin oxide (ITO), or the like.

Portions of first transparent electrode 142 may extend from underneath covering layers 144, 146, 148, 150 to allow for electrical connection. If clips, such as clip 36, are used to connect conductive strips 30 on transparent base substrate 140 to traces 34 on support substrate 24, additional clips may be used to provide control signals to first transparent electrode 142 and second transparent electrode 150. If clipless bonding is used to join transparent base substrate 140 to support substrate 24, wires may be bonded between transparent electrodes 142, 150 and corresponding bonding pads on support substrate 24.

Additional constructions for solid state electrochromic attenuators known in the art may also be built on transparent base substrate 140.

Referring now to FIG. 10, a cross-sectional view of an embodiment of the present invention using a transparent curable resin in place of a back cover is shown. In the embodiments described with regards to FIGS. 8 and 9, spacer 128 and cover 130 may be replaced or supplemented by a coating of transparent curable resin 154, such as epoxy, around sensor 22. The resin may be self curing or may be cured by exposure to heat, ultraviolet light, an electron beam, or the like.

Any of the embodiments described with regards to FIGS. 8 through 10 may use any of the means for connecting each conductive strip 30 to a corresponding trace 34 on the support substrate described with regards to FIGS. 1 through 4 and 7 above. These include clips for direct solder mount or through-hole mount to support substrate 24, clipless attachment to support substrate 24, and connection to flexible circuit support substrate 24.

Figure 11:
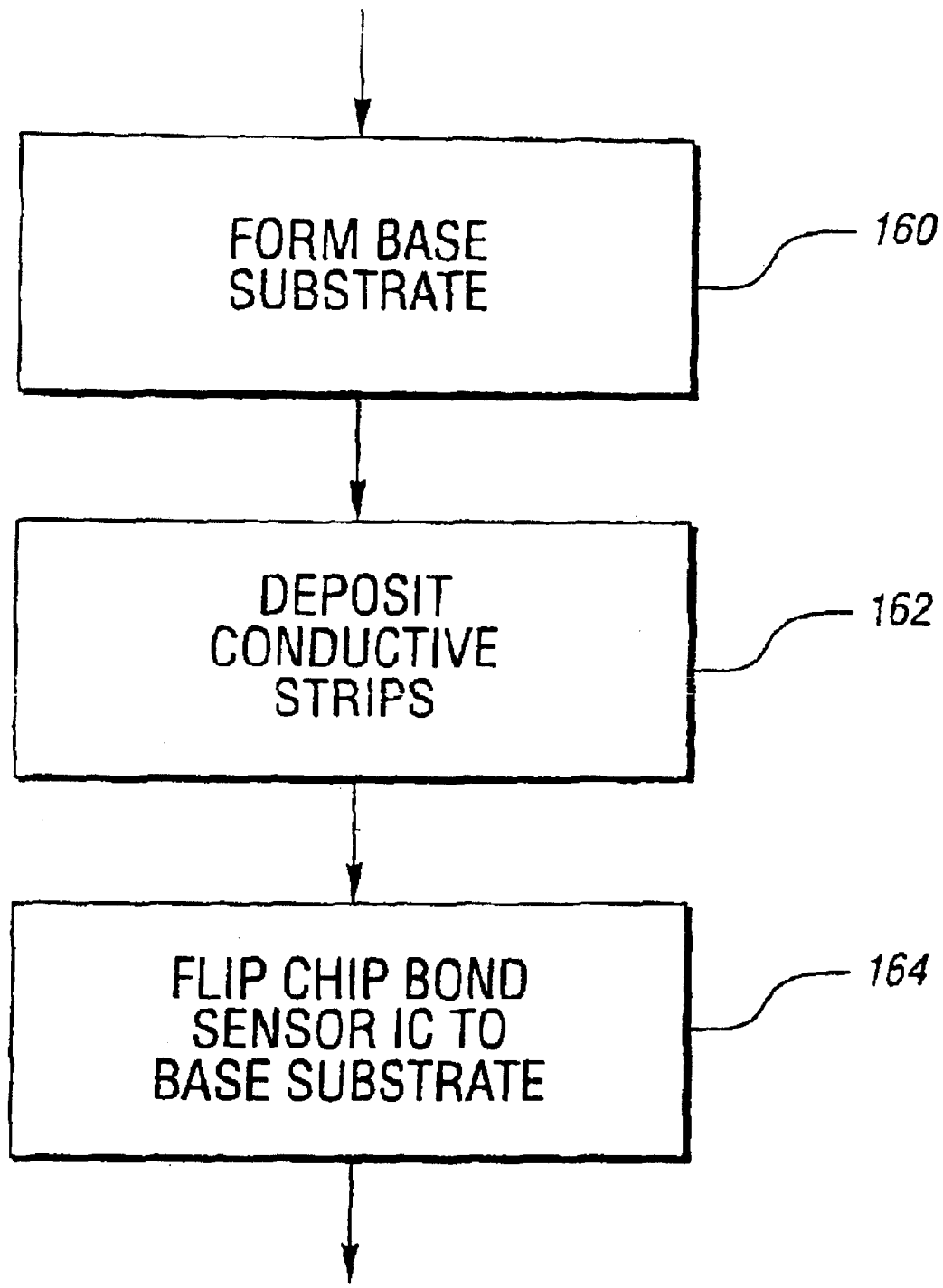
FIG. 11 is a flow diagram showing a process for making an embodiment of the present invention with the sensor flip chip bonded to the base substrate.

Referring now to FIG. 11, a flow diagram showing a process for making an embodiment of the present invention with the sensor flip chip bonded to the base substrate is shown. As will be appreciated by one of ordinary skill in the art, the operations illustrated are not necessarily sequential operations.

Base substrate 28, 140 is formed in block 160. Base substrate 28, 140 may be formed as described with regards to block 100 in FIG. 7 above. For opaque base substrate 28, hole 122 is formed.

Conductive strips are deposited in block 162. Techniques that may be used to form conductive strips 30 on the bottom of base substrate 28 are described with regards to block 102 in FIG. 7 above.

The sensor integrated circuit is flip chip bonded to the base substrate in block 164. The top of optical sensor 22 is bonded to the bottom of base substrate 28 using a flip chip technology such as tape-automated bonding, fluxless solder bumps, isotropic conductive adhesives, anisotropic conductive adhesives, metal bumps, compliant bumps, pressure contacts, and the like. In one embodiment, solder bump 120 is deposited on wettable metal sensor bonding pad 26. A matching solder wettable terminal footprint is made with conductive strip 30 on base substrate 28, 140. Optical sensor 22 is aligned to base substrate 28, 140 and all solder joints are made simultaneously by reflowing solder bump 120.

In the embodiment wherein substrate 28 is opaque and contains hole 122, seal material 124 is used to bond window 126 to substrate 28. Seal material 124 may be formed as described with regards to forming seal material 46 in block 108 of FIG. 7. Window 126 may be bonded to base substrate 28 as described with regards to window 48 in block 108 of FIG. 7.

In embodiments including cover 130, seal material 128 and cover 130 may be added as described with regards to seal material 46 and window 48 in block 108 respectively of FIG. 7.

FIG. 14 shows a camera constructed in accordance with the present invention. As illustrated, camera 200 includes a base support 206, which may be a printed circuit board, body of a camera, or other mounting support. Camera 200 further includes a lens support 202 extending outward from base support 206. Lens support 202 supports one or more lenses 204 and 209 as may typically be employed in a camera or other optical device. Lens support 202 may support a first electrochromic element 208 between lenses 204 and 209.

Electrochromic element 208 may be provided to function as a variable light filter and/or an adjustable aperture for adjusting the depth of field and exposure level of the image to be recorded. A second electrochromic element 210, which may have a structure similar to that shown in FIG. 12, may optionally be provided between lens 204 and an image recorder 212. Image recorder 212 may be an image sensor package or any other medium upon which an image may be recorded, such as photographic film. Second electrochromic element 210 may be used as a shutter or variable transmittance filter. First electrochromic element 208 could be used as a shutter, variable light transmittance filter, and iris simultaneously.

By utilizing an electrochromic element as an adjustable aperture or iris for the camera, the mechanical iris that is commonly used in cameras, as well as any motorized mechanism for automatically adjusting such iris, may be eliminated. This allows a camera to be made more compact and lighter since there would be less moving parts. An additional advantage of utilizing an electrochromic element as an adjustable aperture is that it allows for the depth of field of the image to be viewed to be varied in the same manner as a mechanical iris unlike an electrochromic element used as a variable transmittance filter, which changes its transmittance level uniformly across the element.

To construct an electrochromic element that may be used as an adjustable aperture, the electrochromic element should be configured to exhibit a non-uniform transmittance in response to an electrical signal applied to the electrochromic medium within the element. To obtain such a non-uniform transmittance, various modifications to a conventional electrochromic element may be made. One way to obtain non-uniform transmittance is to modify one or both of substrates 214 and 215 to have a convex inner surface. This causes non-uniform cell spacing, which, in turn, results in a higher transmittance in the central portion of the element with lower transmittance in the periphery of the element with the extent of the variance changing depending upon the electric potential applied to the electrodes formed on the inner surfaces of the substrates. Examples of such constructions are shown in FIGS. 15 and 16. In these figures, a first substrate 214 and a second substrate 215 each have opposing inner surfaces 214a and 215a, respectively. These inner surfaces are non-planar, and preferably are both convex. A first transparent electrode 218 is formed on surface 214a of first substrate 214 and a second transparent electrode 220 is formed on inner surface 215a of second substrate 215. The structure shown in FIG. 16 is similar to that shown in FIG. 15 except that outer surfaces 214b and 215b of first substrate 214 and second substrate 215 are concave rather than planar.

Another way to obtain non-uniform transmittance in an electrochromic element is to modify one or both of the first or second electrodes to have a non-uniform resistance over the region in contact with the electrochromic medium. Another technique is to utilize a solid state electrochromic medium having varying concentrations of electrochromic active materials dispersed throughout the solid state medium. For example, the central portion of the solid state medium may include a lower concentration of electrochromic material than the peripheral portions.

An electrochromic element having a non-uniform transmittance may also be formed by decreasing the cell spacing to less than about 50 micrometers, increasing the resistance of the electrodes to at least about 80 ohms per square, and utilizing a highly concentrated electrochromic medium. Still another way to obtain a non-uniform transmittance is to form at least one of the first and second electrodes as discrete sections having different resistance resistance towards the center of the element. Such increased resistance at the central portion of the electrochromic aperture reduces the current flow through the central portion relative to the peripheral portions and thereby decreases the transmission in the peripheral portions relative to the central portion.

Another technique for making an electrochromic element with a non-uniform transmittance is to provide a control circuit that supplies current that flows through the electrochromic elements and that periodically shunts the element.

Not only does an electrochromic element functioning as an adjustable iris reduce the size and complexity of a camera that otherwise would utilize a mechanical iris, an electrochromic element provides optical improvements over that of a mechanical iris. As shown in the plot in FIG. 17, the transmittance of a mechanical stop as a function of its diameter is more or less a step function. The electrochromic element, on the other hand, has a sloping transmittance gradient approximating a parabolic function of the radius of the aperture. By providing a more gradual change in transmittance, an electrochromic element offers the advantage that it does not cause diffraction, as do the edges of the mechanical aperture.

While electrochromic iris 208 is described above as being used in a camera, those skilled in the art will recognize that such an electrochromic iris may be used in any optical system in which irises are utilized.

While the best modes for carrying out the invention have been described in detail, other possibilities exist within the spirit and scope of the present invention. For example, additional dies containing support electronics may be enclosed within the package. Those familiar with the art to which this invention relates will recognize various alternative designs and embodiments for practicing the invention as defined by the following claims.

What is claimed is:

1. An optical sensor system configured to be mounted to a vehicle, comprising: at least one optical sensor and at least one lens; and at least one electro-optic variable aperture positioned between said at least one optical sensor and said at least one lens along an optical axis of said optical sensor, wherein said electro-optic variable aperture comprises a solution-phase medium electro-optic medium.

2. An optical sensor system as in claim 1 wherein said electro-optic medium is a free-standing gell.

3. An optical sensor system as in claim 1, said electro-optic variable aperture comprising at least one substrate comprising a convex inner surface.

4. An optical sensor system as in claim 1, said electro-optic variable aperture comprising at least one substrate comprising an electrode layer on at least one surface comprising a variable sheet resistance.

5. An optical sensor system as in claim 4 wherein said variable sheet resistance defines a series of concentric rings and, or, a circle.

6. An optical sensor system as in claim 5, said series of concentric rings comprising at least one inner ring or circle comprising a higher sheet resistance than at least one outer ring.

7. An optical sensor system as in claim 1, said electro-optic variable aperture comprising an electro-optic medium comprising varying concentrations of active materials.

8. An optical sensor system as in claim 7 wherein said varying concentrations of active materials define a series of concentric rings and, or, a circle.

9. An optical sensor system as in claim 8, said series of concentric rings comprising at least one inner ring or circle comprising a higher sheet resistance than at least one outer ring.

10. An optical sensor system as in claim 1, said electro-optic variable aperture comprising a cell spacing of about 50 .mu.m.

11. An optical sensor system as in claim 1, said electro-optic variable aperture comprising at least one substrate comprising an electrode comprising a sheet resistance greater than about 80 .OMEGA./.quadrature..

12. An optical sensor system as in claim 1, said electro-optic variable aperture comprising a highly concentrated electro-optic medium.

13. An optical sensor system as in claim 1 further comprising a control configured to at least periodically shunt said electro-optic variable aperture.

14. An optical system configured to be mounted to a vehicle, comprising: at least one electro-optic variable aperture comprising at least a center area with different light ray attenuation characteristics than an area at least partially surrounding said center area, wherein the optical system is incorporated in a vehicle equipment system.

15. An optical system as in claim 14 wherein said electro-optic variable aperture comprises an electro-optic medium selected from the group comprising: a solution-phase medium, a surface confined medium, a solid state medium and an electrodeposition medium.

16. An optical system as in claim 14, said electro-optic variable aperture comprising at least one substrate comprising a convex inner surface.

17. An optical system as in claim 14, said electro-optic variable aperture comprising at least one substrate comprising an electrode layer on at least one surface comprising a variable sheet resistance.

18. An optical system as in claim 17 wherein said variable sheet resistance defines a series of concentric rings and, or, a circle.

19. An optical system as in claim 18, said series of concentric rings comprising at least one inner ring or circle comprising a higher sheet resistance than at least one outer ring.

20. An optical system as in claim 14, said electro-optic variable aperture comprising an electro-optic medium comprising varying concentrations of active materials.

21. An optical system as in claim 20 wherein said varying concentrations of active materials define a series of concentric rings and, or, a circle.

22. An optical system as in claim 21, said series of concentric rings comprising at least one inner ring or circle comprising a higher sheet resistance than at least one outer ring.

23. An optical system as in claim 14, said electro-optic variable aperture comprising a cell spacing of about 50 .mu.m.

24. An optical system as in claim 14, said electro-optic variable aperture comprising at least one substrate comprising an electrode comprising a sheet resistance greater than about 80 .OMEGA./.quadrature..

25. An optical system as in claim 14, said electro-optic variable aperture comprising a highly concentrated electro-optic medium.

26. An optical system as in claim 14 further comprising a control configured to at least periodically shunt said electro-optic variable aperture.

27. An optical sensor system configured to be mounted to a vehicle, comprising: at least one optical sensor; and at least one electro-optic variable aperture positioned along an optical path of said at least one optical sensor, said electro-optic variable aperture is operable to selectively attenuate light rays, wherein the optical sensor system is incorporated in a vehicle equipment system.

28. An optical sensor system as in claim 27 wherein said electro-optic variable aperture comprises an electro-optic medium selected from the group comprising: a solution-phase medium, a surface confined medium, a solid state medium and an electrodeposition medium.

29. An optical sensor system as in claim 27, said electro-optic variable aperture comprising at least one substrate comprising a convex inner surface.

30. An optical sensor system as in claim 27, said electro-optic variable aperture comprising at least one substrate comprising an electrode layer on at least one surface comprising a variable sheet resistance.

31. An optical sensor system as in claim 30 wherein said variable sheet resistance defines a series of concentric rings and, or, a circle.

32. An optical sensor system as in claim 31, said series of concentric rings comprising at least one inner ring or circle comprising a higher sheet resistance than at least one outer ring.

33. An optical sensor system as in claim 27, said electro-optic variable aperture comprising an electro-optic medium comprising varying concentrations of active materials.

34. An optical sensor system as in claim 33 wherein said varying concentrations of active materials define a series of concentric rings and, or, a circle.

35. An optical sensor system as in claim 34, said series of concentric rings comprising at least one inner ring or circle comprising a higher sheet resistance than at least one outer ring.

36. An optical sensor system as in claim 27, said electro-optic variable aperture comprising a cell spacing of about 50 .mu.m.

37. An optical sensor system as in claim 27, said electro-optic variable aperture comprising at least one substrate comprising an electrode comprising a sheet resistance greater than about 80 .OMEGA./.quadrature..

38. An optical sensor system as in claim 27, said electro-optic variable aperture comprising a highly concentrated electro-optic medium.

39. An optical sensor system as in claim 27 further comprising a control configured to at least periodically shunt said electro-optic variable aperture.

* * * * *